(12) United States Patent
Cordes et al.

(10) Patent No.: US 7,506,794 B1
(45) Date of Patent: Mar. 24, 2009

(54) HIGH-TEMPERATURE ALLOY STANDOFFS FOR INJECTION MOLDING OF SOLDER

(75) Inventors: Steven A. Cordes, Yorktown Heights, NY (US); Peter A. Gruber, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/166,505

(22) Filed: Jul. 2, 2008

(51) Int. Cl.
*H05K 3/34* (2006.01)
*H01L 21/00* (2006.01)
*H01L 23/488* (2006.01)

(52) U.S. Cl. .................. 228/180.22; 228/225; 228/254; 438/107; 438/108

(58) Field of Classification Search .............. 228/180.1, 228/180.22, 254; 438/107–108, 613
See application file for complete search history.

(56) References Cited

U.S. PATENT DOCUMENTS

| 5,244,143 | A | 9/1993 | Ference et al. |
| 5,968,670 | A | 10/1999 | Brofman et al. |
| 6,196,443 | B1 * | 3/2001 | DiGiacomo ............ 228/180.22 |
| 6,276,596 | B1 * | 8/2001 | Gruber et al. ............... 228/225 |
| 6,824,041 | B2 | 11/2004 | Grieder et al. |
| 2007/0178625 | A1 * | 8/2007 | Danovitch et al. .......... 438/108 |
| 2007/0269928 | A1 * | 11/2007 | Farooq et al. ............... 438/108 |

* cited by examiner

*Primary Examiner*—Jessica L. Ward
*Assistant Examiner*—Devang Patel
(74) *Attorney, Agent, or Firm*—Scully, Scott, Murphy & Presser, P.C.; Daniel P. Morris, Esq.

(57) ABSTRACT

A method in forming high-temperature alloy solder standoff in a solder bumping process, such as in injection molded solder molds. The standoffs are formed in an injection molded solder mold, by means of pre-depositing a layer of a metal at select sites, such as some of the cavities which are formed in the surface of the mold, and thereafter, filling the mold cavities with solder, utilizing standard techniques as known in the technology. The particular metal, which is deposited in at least some of the mold cavities, will alloy with the solder during or after transfer, and will result in the formation of a higher temperature alloy solder at select locations in the mold cavities.

1 Claim, 1 Drawing Sheet

HIGH-TEMPERATURE ALLOY STANDOFFS FOR INJECTION MOLDING OF SOLDER

BACKGROUND OF THE INVENTION

1. Field of the Invention

The present invention generally pertains to the injection molding of solder, and more particularly relates to a method in the formation of high-temperature alloy solder standoff in a solder bumping process, such as in injection molded solder molds.

2. Discussion of the Prior Art

In modem semiconductor devices, the ever-increasing electronic component densities on the devices and reduced dimensions of the devices demand more stringent requirements in the packaging or interconnecting techniques thereof. Generally, a known flip-chip attachment method has been used in the packaging of IC chips, wherein a formation of solder balls was carried out by an evaporation method of lead and tin through a mask for producing the desired solder balls. Another method employs electroplating of solder, which requires large volumes of chemical baths and which is especially hazardous due to the fact that many solders contain lead.

Another known method for depositing solder balls is solder paste screening. However, with the recent trend in the miniaturization of device dimensions and the reduction in bump-to-bump spacing (or pitch), the solder paste screening technique becomes impractical. For instance, one of the problems in applying solder paste screening technique to modem IC devices is the paste composition itself, in that this is generally composed of a flux and solder alloy particles. The consistency and uniformity of the solder paste composition becomes more difficult to control with a decreasing solder bump volume.

A more recently developed injection molded solder ("IMS") technique has improved upon the foregoing methods by dispensing molten solder instead of solder paste. However, some problems have been encountered when the technique is implemented to wafer-sized substrates. U.S. Pat. No. 5,244,143, which is commonly assigned to the assignee of the present application, discloses the fundamentals of the injection molded solder technique, and the disclosure of which is incorporated herein by reference in its entirety. One of the advantages of the IMS technique is that there is very little volume change between the molten solder and the resulting solder bump. The IMS technique utilizes a solder head that fills boro-silicate glass molds that are wide enough to cover most single chip modules.

Applying a molten solder to a substrate in a transfer process step then implements the !MS method for solder bonding. When smaller substrates, i.e., chip scale or single chip modules are employed, the transfer step is readily accomplished since the solder-filled mold and substrate are relatively small in area and thus can be easily aligned and joined in a number of configurations. For instance, a process of split-optic alignment is frequently used in joining chips to substrates, whereby the same process may also be used in order to join a chip-scale IMS mold to a substrate (chip) which is to be bumped. The solder, which is applied to semiconductor wafers for flip chip bonding, forms the electrical connection between the device substrate (i.e., silicon chip) and the package (e.g. ceramic module, organic package, etc), as well as providing the mechanical connection between the device and the package. The mechanical properties of the connection are controlled by the properties of the materials, such as tensile strength, ductile strength and surface tension. These properties also play a role in a so-called standoff height, i.e., the separation between the two substrates. Under no-load conditions, this standoff will be largely controlled by the surface tension of the material. However, as the load increases, the standoff will be decreased to the point of contact between the nearest points, such that can reduce the integrity of the connection between the components.

SUMMARY OF THE INVENTION

Accordingly, in order to provide advantages over the current state of the technology, pursuant to the present invention, standoffs are formed in the injection molded solder (IMS) mold by means of pre-depositing a layer of a metal at select sites, such as some of the cavities that are formed in the surface of the mold, and thereafter, filling the mold cavities with solder, utilizing standard techniques as known in the technology. The particular metal, which is deposited in at least some of the mold cavities, will alloy with the solder during or after transfer, and will result in the formation of a higher temperature alloy solder at select locations in the mold cavities.

Pursuant to the invention, standoffs are automatically formed in those particular cavities containing the high-temperature solder to the required precise size, and which can be accurately controlled. These standoffs are produced utilizing currently available standard manufacturing techniques, and are readily manufacturable employing bulk processing in an inexpensive, economical manner.

Accordingly, it is an object of the present invention to provide a novel method of forming high-temperature alloy solder standoffs in an injection molded solder mold.

BRIEF DESCRIPTION OF THE DRAWINGS

Reference may now be made to the following detailed description of a preferred embodiment of the invention; taken in conjunction with the accompanying drawings; in which.

DETAILED DESCRIPTION OF THE INVENTION

Figure 1A:
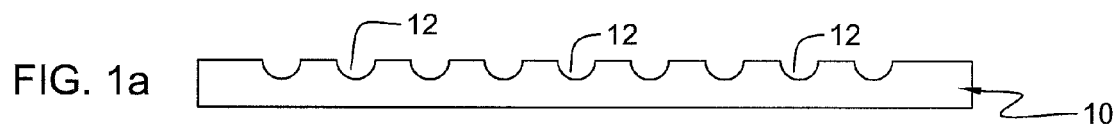
FIGS. 1a through 1f illustrate sequential method steps in forming high-temperature alloy solder standoffs in an injection molded solder mold.

Referring now in detail to the illustrated embodiment of the inventive method, as represented in FIGS. 1a through 1f of the drawings, FIG. 1a illustrates an essentially standard injection molded solder mold 10 incorporating a plurality of cavities 12, which in this case are hemispherical in shape, although other shapes are contemplatable. The mold, as is well known in the technology, is generally formed of a suitable dielectric material, such as a boro-silicate glass, or the like.

Figure 1B:
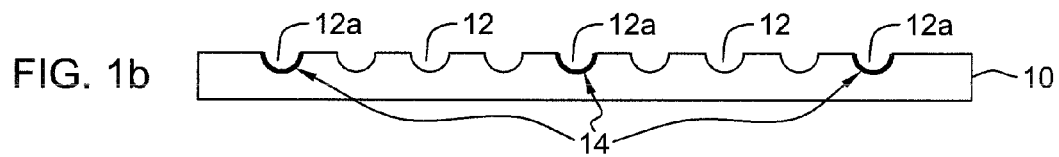

As indicated in FIG. 1b of the drawings, at various locations, some of the cavities 12a are lined with a metal 14, preferably, but not necessarily, employing a shadow mask or sputtering technique.

Figure 1C:
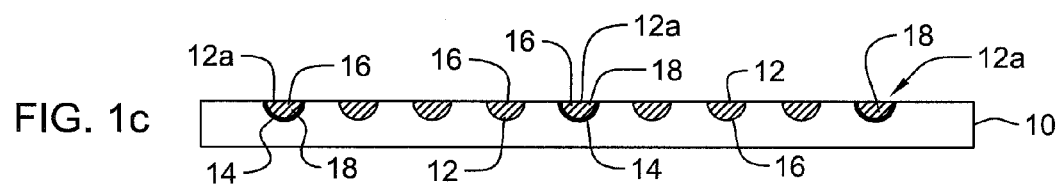

All of the cavities 12, 12a in the mold 10, as illustrated in FIG. 1c of the drawings, are then filled with a solder 16, employing standard techniques, and wherein the solder 16 will then alloy with the metal 14 in the selected cavities 12a of FIG. 1b, so as to produce a higher temperature solder alloy 18, in the shape of solder balls.

Figure 1D:
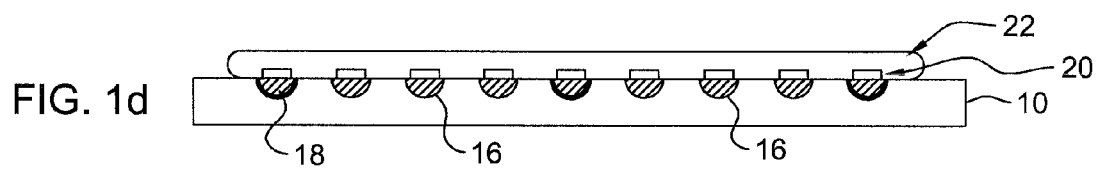

As illustrated in FIG. 1d of the drawings, the mold 10 has the cavities 12, 12a aligned with bonding pads 20 on a wafer 22 which is superimposed thereon, and raised to a melting temperature for the alloy constituted of the metal 14 and the solder 16, whereby that temperature is higher than the temperature of the solder 16 itself. As a result, all of the solder 16 and alloy 18 will transfer to the bonding pads 20 on the wafer 22.

Figure 1E:
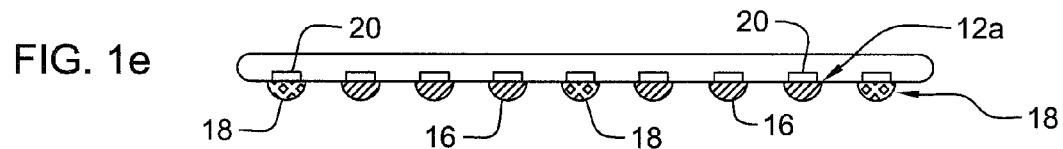

Thereafter, as shown in FIG. 1e of the drawings, the mold 10 is separated from the wafer 22, enabling the balls formed of solder 16 and newly created higher melting temperature solder alloy 18 to remain adherent to the bonding pads 20.

Figure 1F:
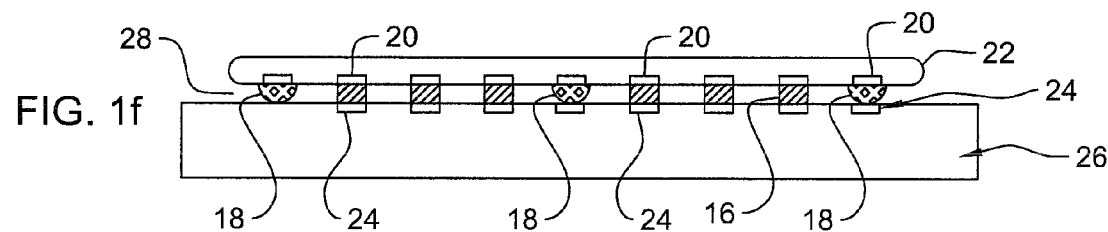

Finally, as shown in FIG. 1f, the solder balls 16, 18, which are now located on the wafer 22, are aligned to bonding pads 24 on a substrate 26, and raised to a temperature which is sufficiently high enough to melt the solder 16, but which is not high enough to melt the solder 16, which is alloyed with the metal 14 to form the alloy 18. As a result, the initial solder 16 bonds the pads 20 on the wafer 22 to the pads 24 on the substrate 26, but does not melt the composite metal alloy and solder material 18, whereby the thickness of the solder will most precisely define the offset or standoff 28 between the two substrates, in effect, the space between the wafer 22 and the substrate 26.

While it is apparent that the invention herein disclosed is well calculated to fulfill the objects stated above, it will be appreciated that numerous modifications and embodiments may be devised by those skilled n the art, and it is intended that the appended claims cover all such modifications and embodiments as fall within the true spirit and scope of the present invention.

What is claimed is:

1. A method of forming high-temperature alloy solder standoffs for solder in injection molded solder molds, said method comprising:

providing a mold consisting of a boro-silicate glass material and having a plurality of cavities formed in a surface thereof;

lining select of said cavities at various locations on said mold with a metal;

filling all of the cavities with a solder to the level of the mold surface;

alloying said solder in the mold cavities, which are lined with said metal to form alloy solder balls;

contacting the solder and alloyed metal and solder balls with bonding pads on a superimposed semiconductor wafer;

raising the temperature caused by alloying of said metal and solder to above that of the solder so as to cause the solder to transfer to the bonding pads on the semiconductor wafer;

removing the mold from said semiconductor wafer while said solder and metal and solder alloy balls remain on said wafer bonding pads; and superimposing bonding pads on a substrate on said solder and metal and solder alloy balls and raising the temperature to melt the solder but lower than the temperature for melting the metal and solder alloy so as to enable the latter to provide a standoff between said semiconductor wafer and said substrate.

* * * * *